(12) United States Patent
Chang et al.

(10) Patent No.: US 6,580,776 B2
(45) Date of Patent: Jun. 17, 2003

(54) GLITCH-FREE FREQUENCY DIVIDING CIRCUIT

(75) Inventors: Horng-Der Chang, Hsinchu (TW); Kuo-Feng Hsu, Hsinchu (TW)

(73) Assignee: Realtek Semiconductor Corp. (TW)

( * ) Notice: Subject to any disclaimer, the term of this patent is extended or adjusted under 35 U.S.C. 154(b) by 0 days.

(21) Appl. No.: 10/093,289

(22) Filed: Mar. 5, 2002

(65) Prior Publication Data

US 2002/0125923 A1 Sep. 12, 2002

(30) Foreign Application Priority Data

Mar. 6, 2001 (TW) ......................................... 090105244

(51) Int. Cl.$^7$ ............................................. H03K 21/00
(52) U.S. Cl. ....................................................... 377/47
(58) Field of Search .............................................. 377/47

(56) References Cited

U.S. PATENT DOCUMENTS 5,872,487 A * 2/1999 Adachi et al. .............. 331/1 A

* cited by examiner

*Primary Examiner*—Margaret R. Wambach

(57) ABSTRACT

The present invention discloses a glitch-free frequency dividing circuit, comprising: a frequency dividing module, dividing the frequency of a reference pulse according to the divisor, outputting a frequency divided output pulse and receiving a control signal such that the state of the frequency divided output pulse is maintained the same when the control signal is enabled; and a latch module, detecting the state of the frequency divided output pulse after a divisor switching signal is received, enabling the control signal when the frequency divided output pulse is as pre-determined, switching the divisor when the frequency divided output pulse is as pre-determined and disabling the control signal after the divisor is switched; whereby the generation of the glitch is prevented during the switching of the divisor.

15 Claims, 8 Drawing Sheets

GLITCH-FREE FREQUENCY DIVIDING CIRCUIT

BACKGROUND OF THE INVENTION

1. Field of the Invention

The present invention generally relates to a frequency dividing circuit, and more particularly to a glitch-free frequency dividing circuit capable of preventing the generation of glitches when the divisor is switched.

2. Description of the Prior Art

A frequency dividing circuit is used to divide a high frequency pulse by an integer divisor and to output a required low frequency pulse to feed other circuits. However, a general frequency dividing circuit with divisor switching function does not provide a detection circuit to monitor and control the timing of switching the divisor, therefore, a glitch may occur in the output signal when the divisor is switched. The glitch may cause malfunction during the sequential operation of the circuit. Moreover, not all frequency dividing circuits provide an output signal with a duty cycle of 50% that limits the application of the frequency dividing circuit.

SUMMARY OF THE INVENTION

Accordingly, the primary object of the present invention is to provide a glitch-free frequency dividing circuit which is capable of preventing the generation of glitches while switching the divisor.

It is another object of the present invention is to provide a glitch-free frequency dividing circuit which has a detection circuit to monitor and control the timing to switch the divisor so as to prevent the glitch generation.

It is still another object of the present invention to provide a glitch-free frequency dividing circuit that operates when the divisor is either even or odd number that will not generate glitches.

It is still another object of the present invention to provide a glitch-free frequency dividing circuit capable of providing an output signal with a duty cycle of 50%.

In order to achieve the foregoing objects, the present invention provides a glitch-free frequency dividing circuit comprising a frequency dividing module and a latch module. When the latch module receives a signal for switching the divisor, the state of the output pulse from the frequency dividing module is detected and the control signal is enabled at a proper time (when the output pulse is at the state of "0", for example) such that the output pulse is maintained at the same state. In addition, when the control signal is enabled, a new divisor is latched in a latch register and the frequency dividing module is provided with the latched divisor. The control signal is then disabled. The frequency dividing module counts the reference pulse and then output the pulse divided by the divisor according to the divisor from the latch module.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a glitch-free frequency dividing circuit can be exemplified by the preferred embodiment as described hereinafter. Like numerals refer to like parts throughout the disclosure. Please refer to FIG. 1, which is a schematic block diagram showing a glitch-free frequency dividing circuit in accordance with the preferred embodiment of the present invention. As shown in the figure, the frequency dividing circuit 1 comprises a latch module 10 and a frequency dividing module 20. When the latch module 10 receives a switch signal, the state of the output pulse from the frequency dividing module 20 is detected and the clear signal is enabled at a proper time (when the output pulse CLK_OUT is at the state of "0", for example) such that the output pulse CLK_OUT is maintained at the same state. The divisor to be switched is latched by the latch module 10 on the positive edge of the next reference pulse CLK_IN. The clear signal is then disabled. The frequency dividing module 20 divides the reference pulse CLK_IN according to the divisor (e.g., the select signal MUX_SEL and the odd/even signal) from the latch module 10. After the clear signal is received by the frequency dividing module 20, the inner flip-flops are kept as pre-determined. Therefore, when the divisor is switched, a glitch will not occur in the output pulse CLK_OUT.

Figure 1:
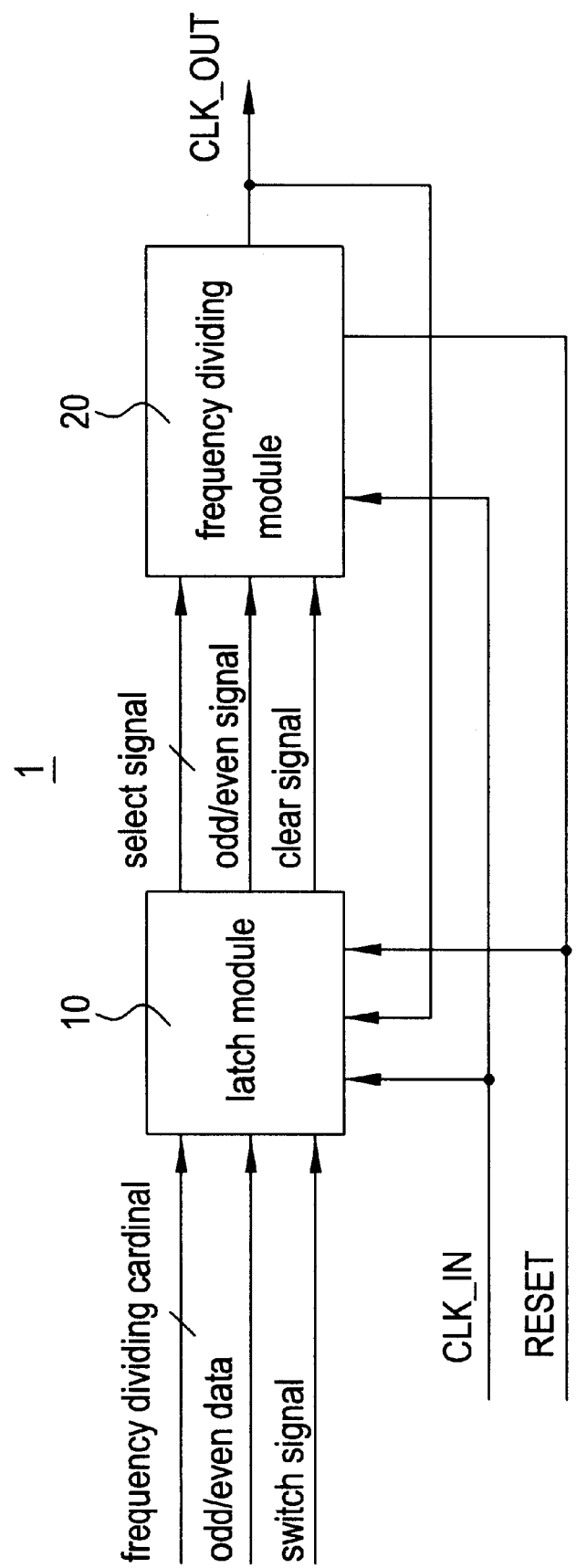
FIG. 1 is a schematic block diagram showing a glitch-free frequency dividing circuit in accordance with the preferred embodiment of the present invention.
Figure 2:
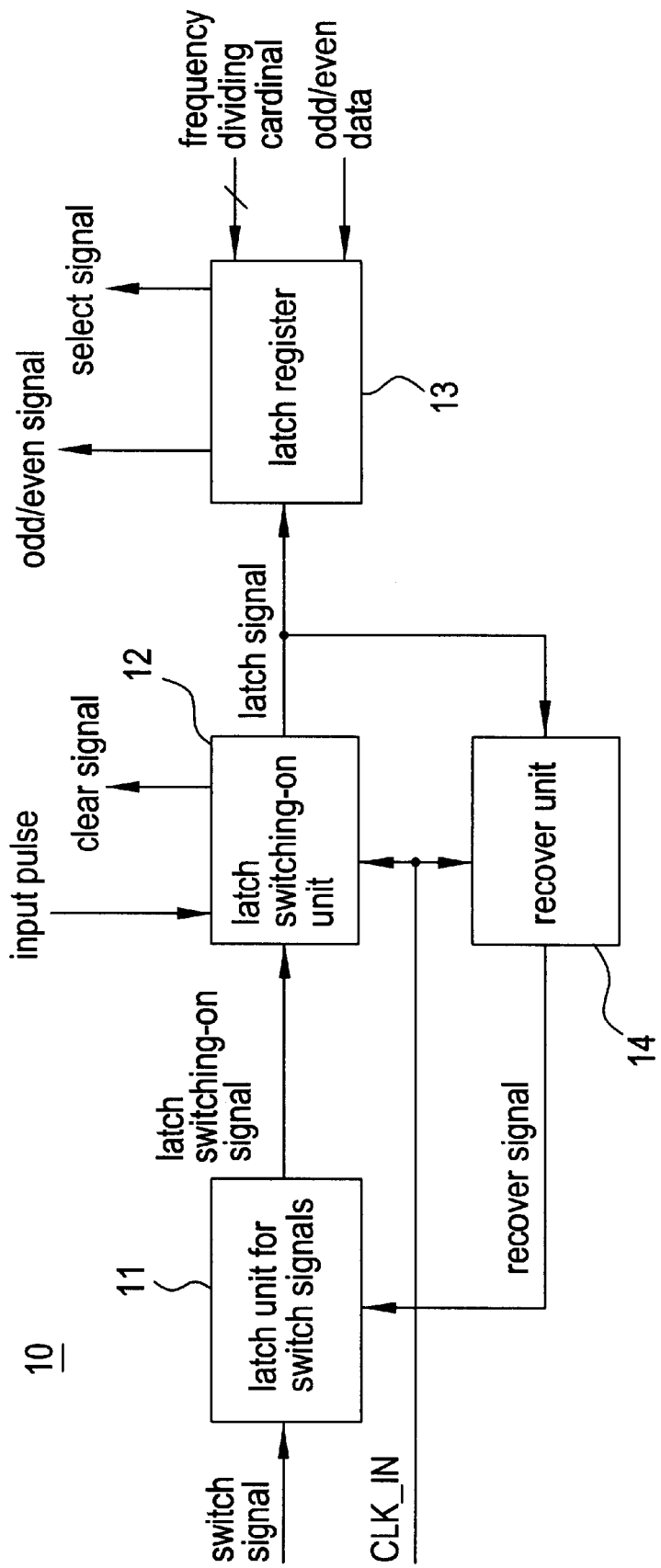
FIG. 2 is a schematic block diagram showing the control of a latch module in FIG. 1.

FIG. 2 is a schematic block diagram showing the control of a latch module 10 in FIG. 1. As shown in the figure, the latch module 10 comprises a latch unit for switch signals 11, a latch switching-on unit 12, a latch register 13, and a recover unit 14. The latch unit for switching signals 11 receives a switch signal and outputs a latch switching-on signal when a recover signal is enabled. Therefore, the switch signal can be a pulse of arbitrary period, independent of the divisor switching process. Certainly, if the pulse period of the switch signal is well adjusted, there will be no need for the latch unit for switch signals 11.

Furthermore, the latch switching-on unit 12 receives a latch switching-on signal and detects the state variation of the output pulse CLK_OUT. When the latch switching-on signal is enabled and the state of the output pulse CLK_OUT is as pre-determined, for example "0", the latch switching-on unit 12 outputs a clear signal such that the output pulse CLK_OUT is maintained unchanged and the latch signal is enabled when the next reference pulse CLK_IN is input. After the latch register 13 receives the enabled latch signal, the divisor to be switched is latched. The latched divisor is then output to the frequency dividing module 20. After the recover unit 14 receives the latch signal, a recover signal is output when the next reference pulse CLK_IN is input such that the latch unit for switch signals 11 is recovered to the initial state for the next switch signal.

Figure 3:
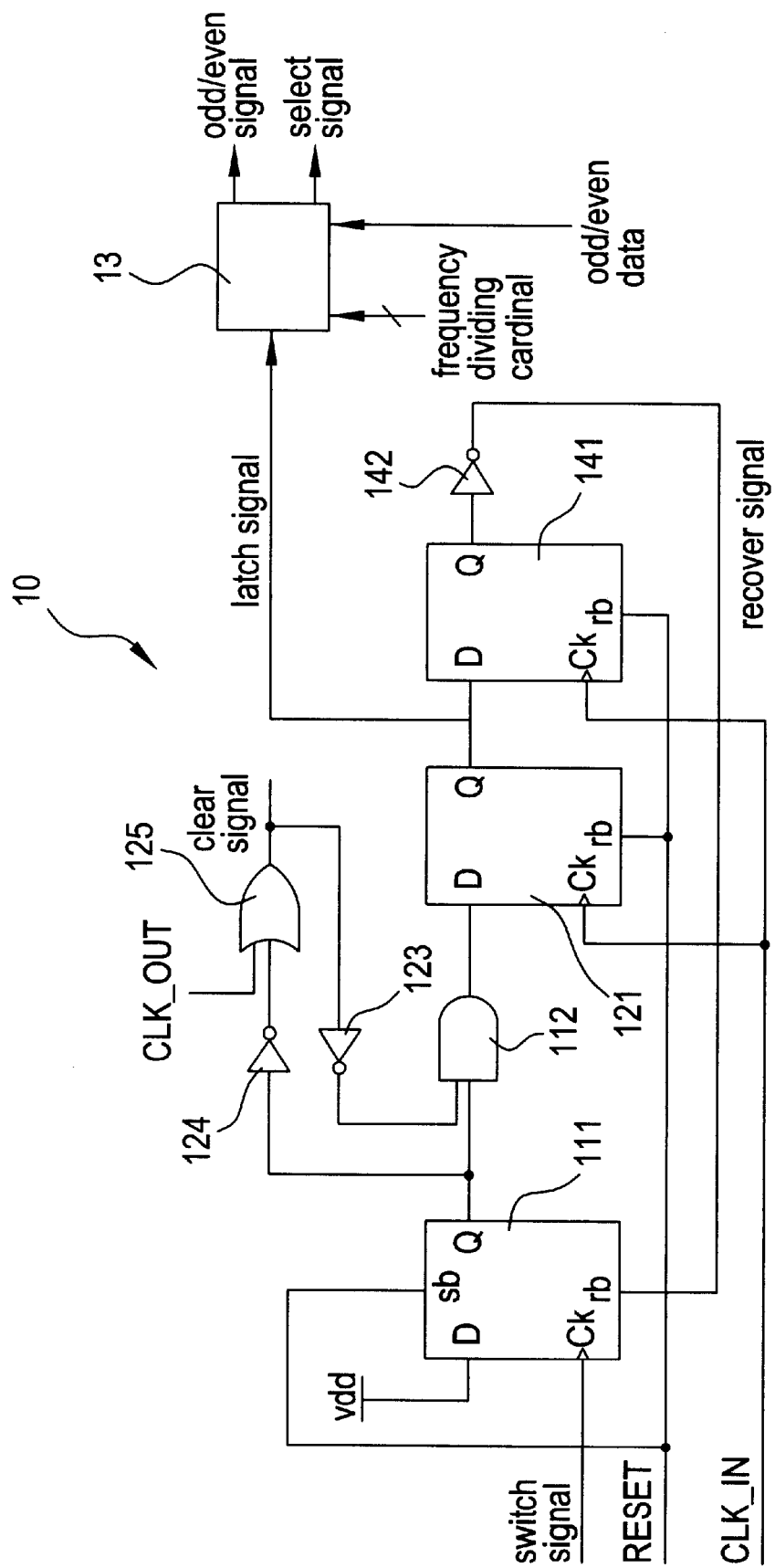
FIG. 3 is an implemented circuit diagram showing the latch module in FIG. 2.

FIG. 3 is an implemented circuit diagram showing the latch module 10 in FIG. 2. In the preferred embodiment, the divisor is switched when the state of the output pulse CLK_OUT is pre-determined as "0". As shown in FIG. 3, the latch unit for switch signals 11 can be implemented by using a flip-flop 111. The latch switching-on unit 12 comprises a flip-flop 121, an AND gate 122, inverters 123 and 124, and an OR gate 125. When the flip-flop 111 is triggered by a switch signal such that Q output "1" and the OR gate 125 outputs a low state control signal when the state of the output pulse CLK_OUT is "0". The clear signal is delivered to the frequency dividing module 20 such that the state of the output pulse CLK_OUT is kept as "0". Meanwhile, the clear signal is delivered through the inverter 123 and the AND gate 122. Therefore, the output of the AND gate 122 becomes "1" and is input into the D-terminal of the flip-flop 121. At this state, the positive edge of the next reference pulse CLK_IN results in an output state "1" of the Q-terminal of the flip-flop 121 and the generation of an enabled latch signal. The latch signal is input into a flip-flop 141 at the same time. Secondly, the recover unit 14 comprises a flip-flop 141 and an inverter 142. When the latch signal is enabled (at the state "1"), the positive edge of the next reference pulse CLK_IN results in an output state "1" of the Q-terminal of the flip-flop 141. After the signal at the state "1" is inverted by the inverter 142, a low state recover signal is generated. The recover signal clears the state of the flip-flop 111 and disables the clear signal such that the Q-terminals of the flip-flops 121 and 141 are cleared by the triggering of the next reference pulse CLK_IN. After the clear signal is disabled, the frequency dividing module 20 re-counts according to the new divisor. Therefore, based on the circuit described above, the latch module 10 switches the divisor only when the state of the output pulse CLK_OUT is kept as "0" such that the generation of a glitch is prevented.

Figure 4:
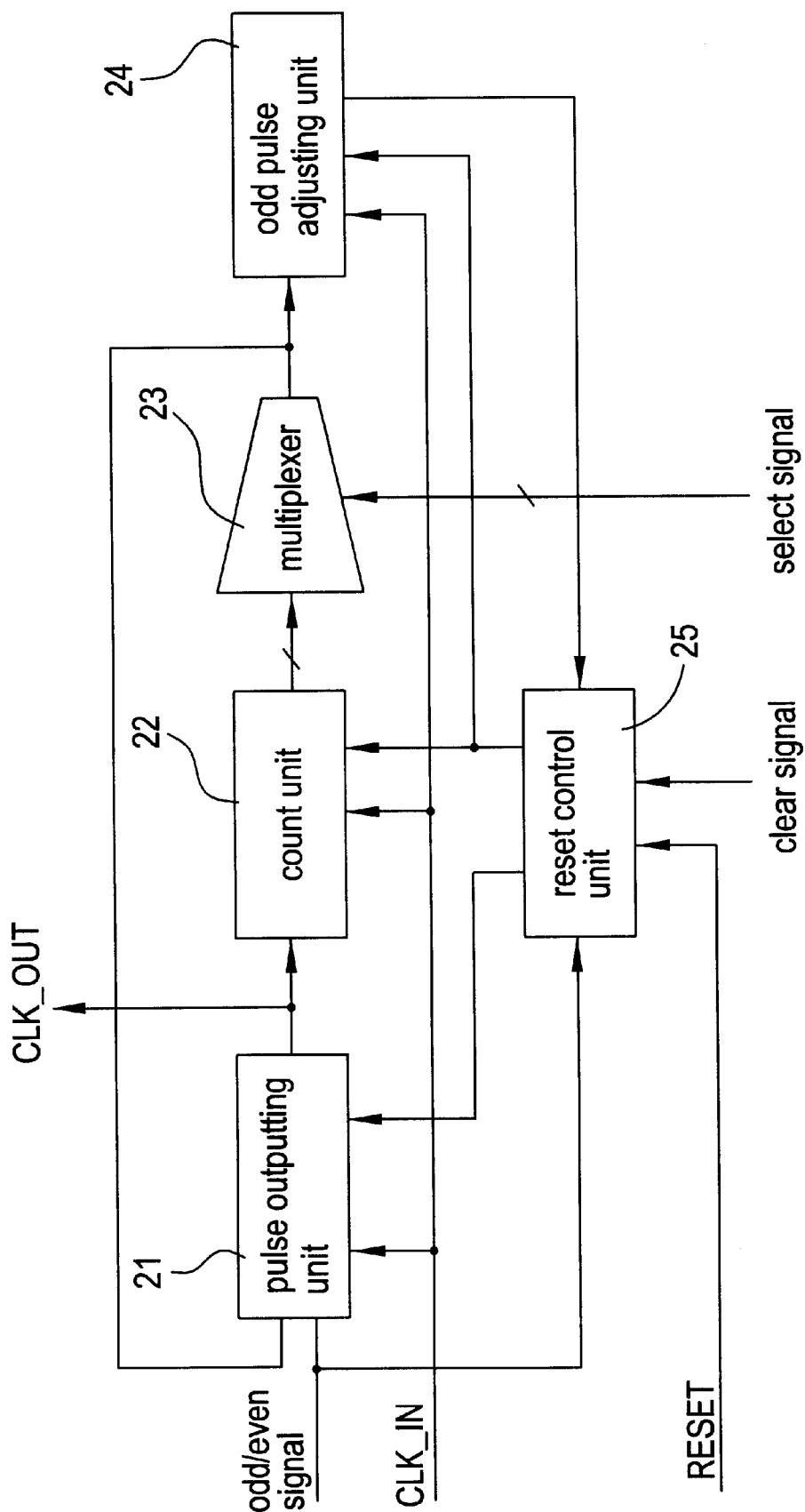
FIG. 4 is a schematic block diagram showing the control of a frequency dividing module in FIG. 1.

Please refer to FIG. 4, which is a schematic block diagram showing the control of a frequency dividing module 20 in FIG. 1. As shown in the figure, the frequency dividing module 20 comprises a pulse outputting unit 21, a count unit 22, a multiplexer 23, an odd pulse adjusting unit 24 and a reset control unit 25. The pulse outputting unit 21 generates an output pulse CLK_OUT according to the odd/even signal and the output signal from the multiplexer 23. The count unit 22 provides count pulses of different count levels, such as with a divisor 2, 4, 6, 8, etc., which is output to the multiplexer 23. The multiplexer 23 provides the pulse outputting unit 21 with a count pulse of one of the different count levels according to the select signal. The odd pulse adjusting unit 24 provides the reset control unit 25 with a control signal when the divisor is odd. The reset control unit 25 generates a reset signal for the pulse outputting unit 21, the count unit 22 and the odd pulse adjusting unit 24 according to the reset signal, the clear signal, the divisor (the select signal and the odd/even signal), and the control signal of the odd pulse adjusting unit 24.

Figure 5:
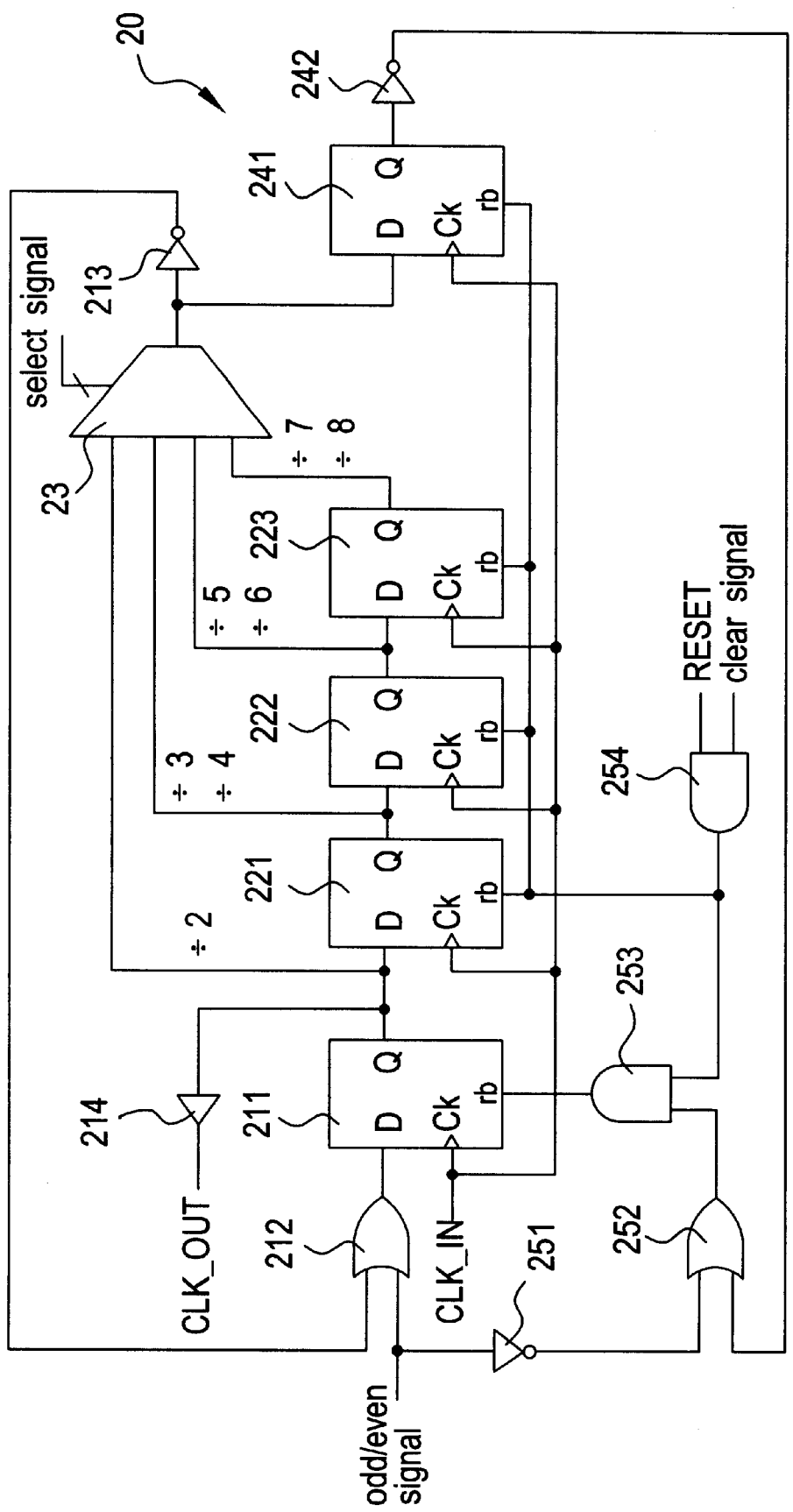
FIG. 5 is an implemented circuit diagram showing the frequency dividing module in FIG. 4.

FIG. 5 is an implemented circuit diagram showing the frequency dividing module 20 in FIG. 4. The pulse outputting unit 21 comprises a flip-flop 211, an OR gate 212, an inverter 213 and a buffer 214. The inverter 213 inverts the output of the multiplexer 23 and delivers this inverted output into the OR gate 212. The OR gate 212 receives the odd/even signal and the output signal from the inverter 213 and then delivers the results into the D-terminal of the flip-flop 211. The signal from the Q-terminal of the flip-flop 211 is output through the buffer 214. This signal is referred to as the output signal CLK_OUT. The count unit 22 comprises flip-flops 221, 222 and 223. The number of flip-flops depends on the divisor value. In the preferred embodiment, the maximum divisor value is 8. That is, the divisor value can be any integer from 2 to 8. The flip-flops 221, 222 and 223 are connected in series. In other words, the flip-flop 221 receives the output from the flip-flop 211, the flip-flop 222 receives the output from the flip-flop 221, and the flip-flop 223 receives the output from the flip-flop 222. Furthermore, each of the flip-flops 211, 221, 222, and 223 is triggered by the positive edge of the reference pulse CLK_IN and the Q-terminals are all connected to the multiplexer 23.

The multiplexer 23 selects one of the outputs from the flip-flops to become the output of the multiplexer 23 according to the select signal. The odd pulse adjusting unit 24 comprises a flip-flop 241, an inverter 242, a flip-flop 251 and an OR gate 252. The input signal into the D-terminal of the flip-flop 241 is the output of the multiplexer 23 and the output signal from the Q-terminal is output from the inverter 242 to the OR gate 252. The OR gate 252 receives the output signal from the inverter 242 and the inverted odd/even signal from the inverter 251. The OR gate outputs the signals to the AND gate 253. Meanwhile, the flip-flop 241 is triggered by the negative edge of the reference pulse CLK_IN. Furthermore, the reset control unit 25 comprises AND gates 253 and 254. The AND gate 254 receives the reset signal and the clear signal of the latch module 10 and then outputs the signals to the count unit 22 and the adjusting unit 24 to serve as the reset signals for the flip-flops 221, 222, 223 and 241. The AND gate 253 receives the signals from the AND gate 254 and the OR gate 252 and then outputs the signals to the pulse outputting unit 21 to serve as the reset signal for the flip-flop 211.

When the divisor is even, the odd pulse adjusting unit 24 in the frequency dividing module 20 does not function. The frequency dividing module 20 generates an output pulse divided by an odd divisor according to the divisor and the output from the odd pulse adjusting unit 24. Since the frequency dividing module 20 employs an odd pulse adjusting unit 24 to control the operation of the pulse outputting unit 21, the present invention provides a frequency-divided signal with a duty cycle of 50%.

Figure 6:
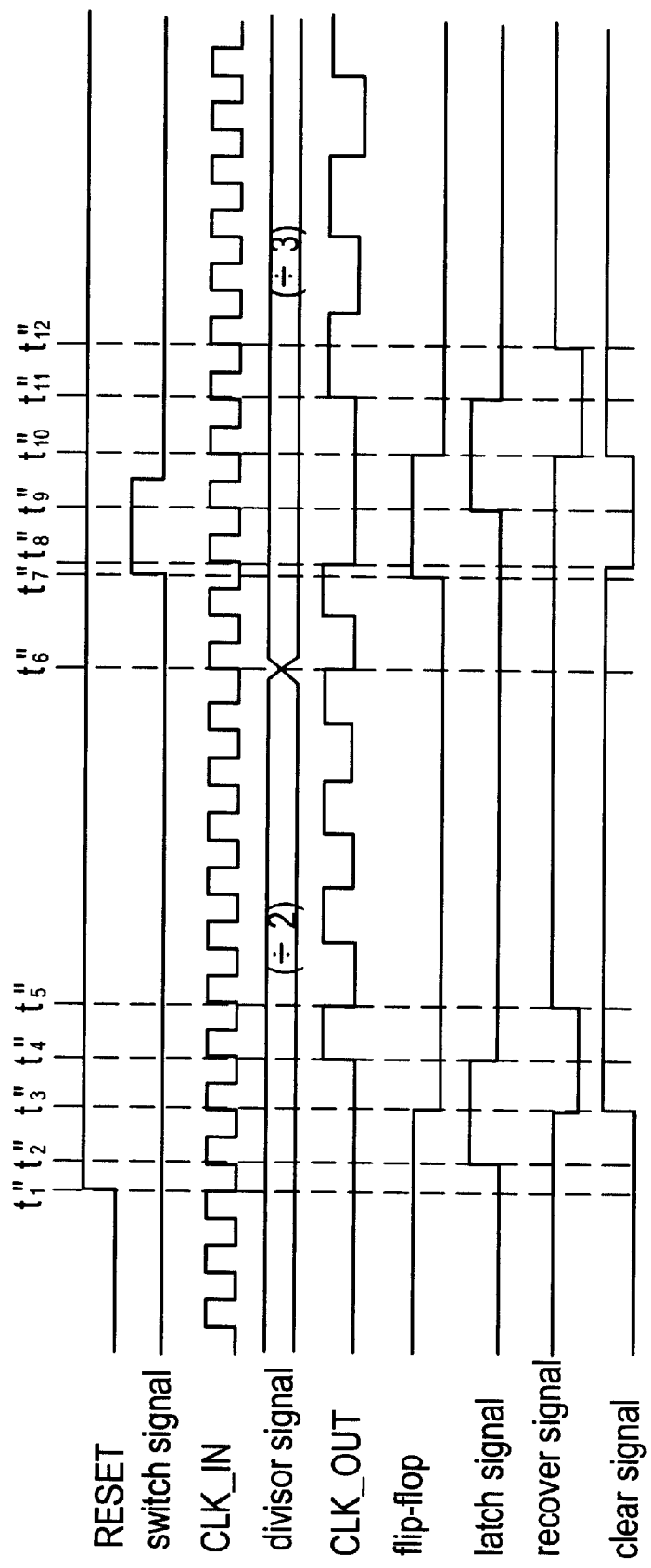
FIG. 6 is an example of the timing diagram for the latch module.
Figure 7:
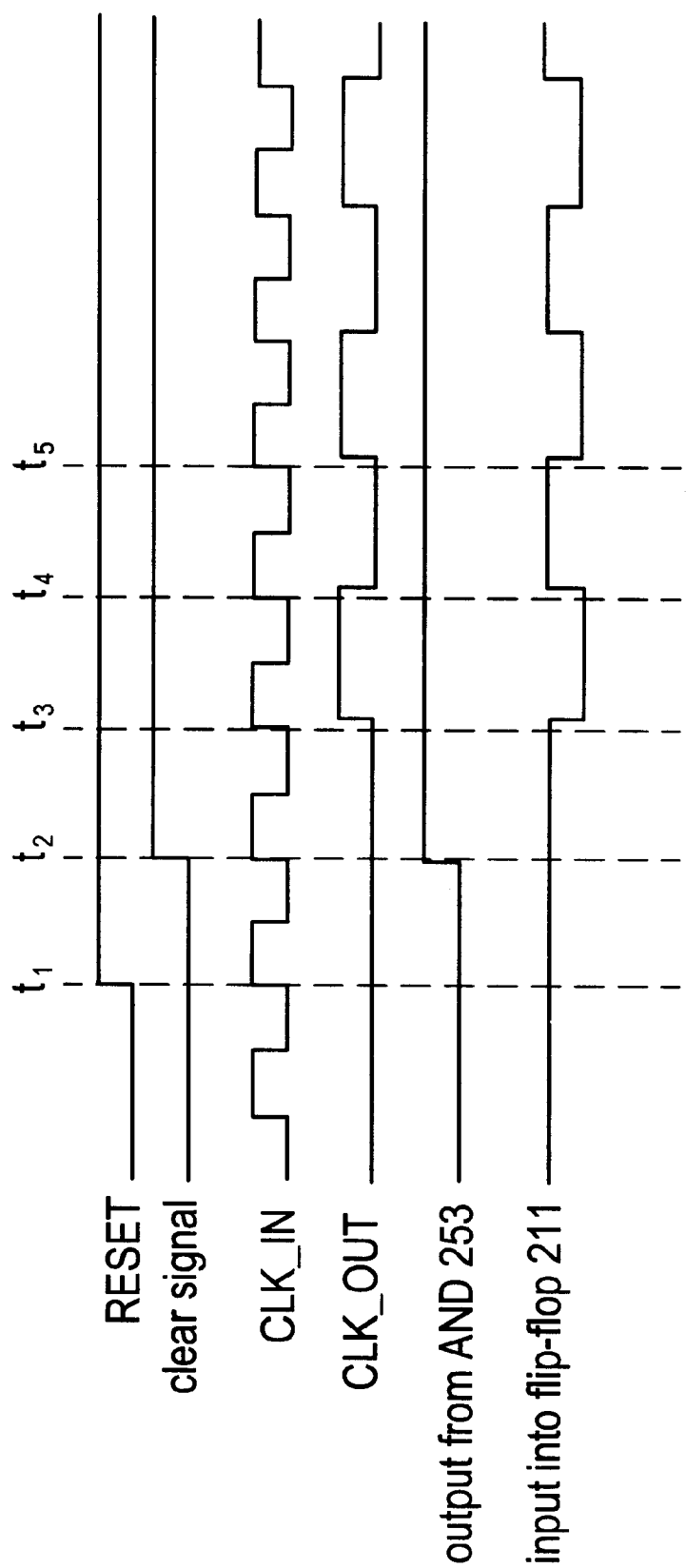
FIG. 7 is a timing diagram for the frequency dividing module when the pulse is divided by 2.
Figure 8:
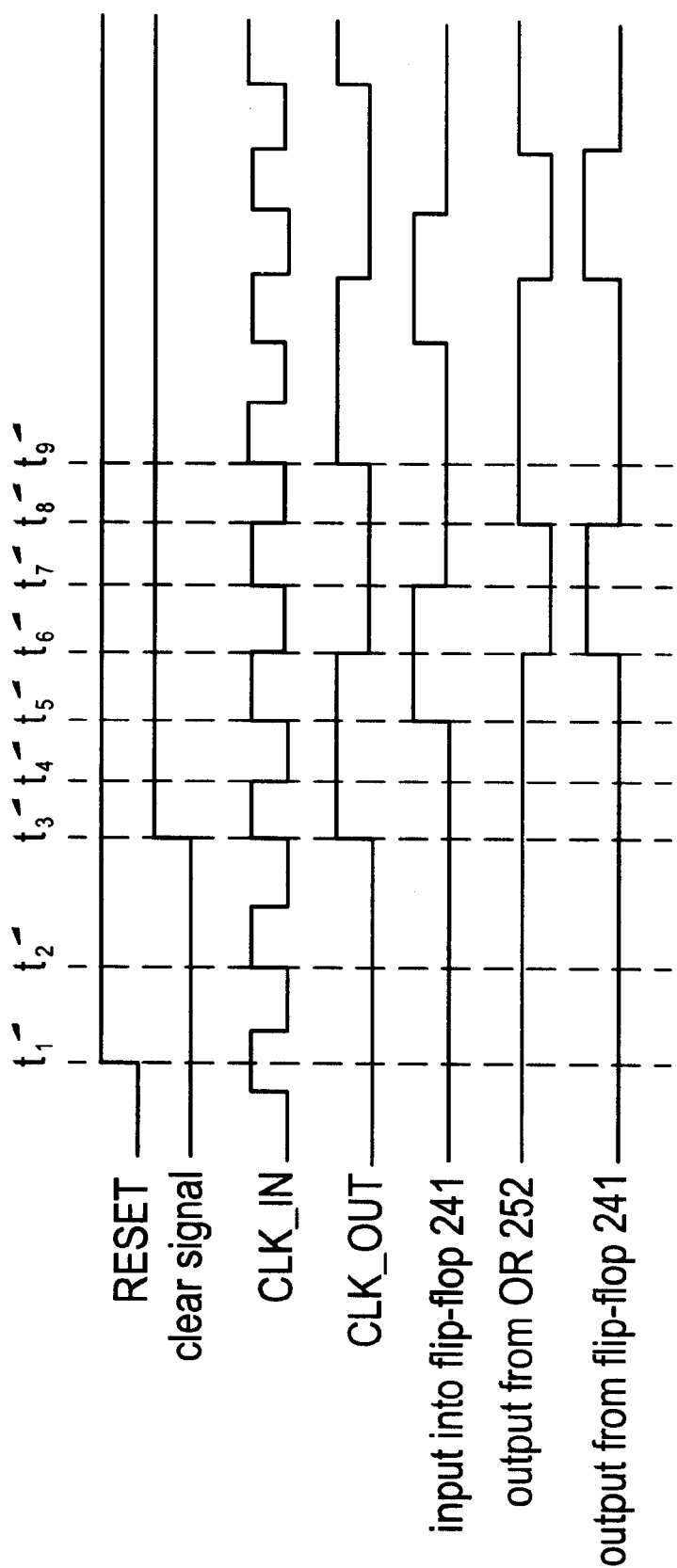
FIG. 8 is a timing diagram for the frequency dividing module when the pulse is divided by 3.

FIG. 6 to FIG. 8 represent the timing diagrams for the circuits in FIG. 3 to FIG. 5, respectively. FIG. 6 shows the timing diagram where the latch module 10 starts to operate and the state for the divisor "2" is switched to the state for the divisor "3". As shown in the figure, when the reset signal is switched to "1" at $t_1$", the output from Q-terminal (the latch signal) is enabled at $t_2$". Meanwhile, the divisor "2" is latched in the latch register 13 and is delivered to the frequency dividing module 20. The state of the output pulse CLK_OUT is kept at "0" since the clear signal is also at "0". Then, the output from the D-terminal of the flip-flop 141 is enabled at a low state by the recover signal from the flip-flop 142 at $t_3$" such that the output from the Q-terminal of the flip-flop 111 becomes "0" at $t_3$" and the clear signal becomes "1" at $t_3$". Therefore, the frequency dividing module 20 generates an output pulse CLK_OUT divided by 2 when the next reference pulse CLK_IN is input (at $t_4$"). The flip-flops 121 and 141 are cleared at $t_4$" and $t_5$", respectively.

In addition, the process for switching the divisor is described hereinafter. Before the switch signal is generated, the divisor is first input. For example, at $t_6$", the divisor "2" is replaced by the divisor "3", the odd/even data becomes "1" and the select signal is "1".

When the switch signal is generated at $t_7$", the output from the Q-terminal of the flip-flop 111 becomes "1". Meanwhile, the state of the output pulse CLK_OUT is at "1", therefore the clear signal is kept at "1" and the input into the D-terminal of the flip-flop 121 is "0". Later, after the state of the output pulse CLK_OUT becomes "0" at $t_8$", the clear signal is enabled at a low state such that the state of the output pulse CLK_OUT is kept at "0" and the input into the D-terminal of the flip-flop 121 becomes "1". When the next reference pulse CLK_IN is input (at $t_9$"), the output from the Q-terminal of the flip-flop 121 (the latch signal) is enabled. The output pulse CLK_OUT is kept at "0". Meanwhile, the divisor "3" is latched in the latch register 13 and is delivered to the frequency dividing module 20. Then, at $t_{10}$", the output from the Q-terminal of the flip-flop 141 is enabled such that the recover signal returns to "0". After the flip-flop 111 is cleared by the recover signal at $t_{10}$", the output from the Q-terminal becomes "0" and the clear signal also becomes "1" at $t_{10}$". Therefore, the frequency dividing module 20 generates an output pulse CLK_OUT divided by 3 when the next reference pulse CLK_IN is input (at $t_{11}$"). The flip-flops 121 and 141 are cleared at $t_{11}$" and $t_{12}$", respectively.

Accordingly, it is obvious from FIG. 6 that the latch module 10 only performs switching when the output pulse CLK_OUT becomes "0" such that it is ensured that the output pulse CLK_OUT will not switch from "1" to "0" and that the generation of the glitch can be prevented.

Please refer to FIG. 7, which is the timing diagram where the frequency dividing module 20 performs with a divisor "2". Since the divisor is "2", the odd/even signal is set as "0" and the select signal is also set as "0" such that the output of the flip-flop 211 is output from the multiplexer 23. The reset signal resets the output from the Q-terminals of the flip-flops 211, 221, 222, 223 and 241 as "0" before $t_1$. Then, the clear signal becomes "1" at $t_2$ under the control of the latch module 10 such that the flip-flops 211, 221, 222, 223 and 241 disable the clear action at $t_2$. Meanwhile, the flip-flop 211 receives the inverted signal from the inverter 213 which receives the output signal from the multiplexer 23. The input into the D-terminal of the flip-flop 211 is "1". Therefore, when the next reference pulse CLK_IN is at its positive edge (i.e., $t_3$), the output from the Q-terminal of the flip-flop 211 becomes "1" and the output pulse CLK_OUT becomes "1". Moreover, after the output from the Q-terminal of the flip-flop 211 is selected by the multiplexer 23, the output is input to the D-terminal of the flip-flop 211 from the inverter 213 such that the input into the D-terminal of the flip-flop 211 becomes "0". Therefore, when the next reference pulse CLK_IN is at its positive edge (i.e., $t_4$), the output from the Q-terminal of the flip-flop 211 becomes "0" and the output pulse CLK_OUT becomes "0". Accordingly, the frequency dividing module 20 achieves the operation with a divisor of "2". Furthermore, it is noted that the odd/even signal is "0" when the divisor is even and that the output from the OR gate 252 is kept as "1", independent of the adjusting unit 24.

On the other hand, FIG. 8 is the timing diagram where the frequency dividing module 20 performs with a divisor "3". Since the divisor is "3", the odd/even signal is set as "1" and the select signal is also set as "1" such that the output of the flip-flop 221 is output from the multiplexer 23. The reset signal resets the output from the Q-terminals of the flip-flops 211, 221, 222, 223 and 241 as "0" before $t_1'$. Then, the clear signal becomes "1" at $t_2'$ under the control of the latch module 10 such that the flip-flops 211, 221, 222, 223 and 241 disable the clear action at $t_2'$. Meanwhile, the input into the D-terminal of the flip-flop 211 is kept as "1". Therefore, when the next reference pulse CLK_IN is at its positive edge (i.e., $t_3'$), the output from the Q-terminal of the flip-flop 211 becomes "1" and the output pulse CLK_OUT becomes "1". Then, when the next reference pulse CLK_IN is at its positive edge (i.e., $t_5'$), the output from the Q-terminal of the flip-flop 221 becomes "1", the output of the multiplexer 23 becomes "1" and the input into the D-terminal of the flip-flop 241 becomes "1". Therefore, at $t_6'$, the output from the Q-terminal of the flip-flop 241 becomes "1" after the flip-flop 241 is triggered by the negative edge of the reference pulse CLK_IN. The output pulse CLK_OUT becomes "0" since the output of the flip-flop 211 is cleared. Then, at $t_7'$, the output from the Q-terminal of the flip-flop 221 becomes "0". Hence, at $t_8'$, the output from the Q-terminal of the flip-flop 241 becomes "0" after the flip-flop 241 is triggered by the negative edge of the reference pulse CLK_IN such that the flip-flop 211 disables the clear action. Therefore, at $t_9'$, the output from the Q-terminal of the flip-flop 211 becomes "1" and the output pulse becomes "1" after the flip-flop 211 is triggered by the positive edge of the reference pulse CLK_IN. Accordingly, the frequency dividing module 20 achieves the operation with a divisor of "3" and the output pulse has a duty cycle of 50%.

According to the above discussion, the present invention discloses a glitch-free frequency dividing circuit, capable of preventing the generation of a glitch when the divisor is switched. The glitch-free frequency dividing circuit provides a detection circuit to monitor and control the timing of switching the divisor so as to prevent the generation of a glitch. Furthermore, the glitch-free frequency dividing circuit provides an output signal with a duty cycle of 50%. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A glitch-free frequency dividing circuit, comprising:
   a frequency dividing module, dividing the frequency of a reference pulse according to a divisor, outputting a frequency divided output pulse and receiving a control signal such that the state of the frequency divided output pulse is maintained the same when the control signal is enabled; and
   a latch module, detecting the state of the frequency divided output pulse after a divisor switching signal is received, enabling the control signal when the frequency divided output pulse is as pre-determined, switching the divisor when the frequency divided output pulse is as pre-determined and disabling the control signal after the divisor is switched;
   whereby the generation of a glitch is prevented during the switching of the divisor.

2. The glitch-free frequency dividing circuit as recited in claim 1, wherein the pre-determined state of the frequency divided output pulse is "0".

3. The glitch-free frequency dividing circuit as recited in claim 2, wherein the latch module comprises:
   a latch unit for divisor switching signals, latching the divisor switching signal and outputting a latch switching-on signal;
   a latch switching-on unit, receiving the latch switching-on signal and the frequency divided output pulse to output a latch signal by the trigger of the reference pulse;
   a latch register, latching the divisor to be switched according to the trigger of the latch signal and outputting the divisor to the frequency dividing module; and
   a recover unit, receiving the latch signal and outputting a recover signal by the trigger of the reference pulse;
      wherein the recover signal is delivered to the latch unit for divisor switching signals such that the latch switching-on signal is disabled and the control signal is disabled.

4. The glitch-free frequency dividing circuit as recited in claim 3, wherein the frequency dividing module comprises:
- a pulse outputting unit, outputting an output pulse by a flip-flop according to the reference pulse;
- a count unit, connected to the pulse outputting unit and composed of a plurality of flip-flops connected in series, wherein the count unit receives the output pulse and outputs pulses having different count levels;
- a multiplexer, connected to the pulse outputting unit and the count unit, and selecting an output pulse from one of the pulse outputting unit and the count unit according to the divisor;
- an odd/even signal control unit, connected to the multiplexer and outputting an odd reset signal according to the output of the multiplexer at the negative edge of the reference pulse; and
- a reset control unit, receiving the control signal, a reset signal, the divisor, the odd reset signal, outputting a first flip-flop control signal to clear a flip-flop state of the pulse outputting unit and outputting a second flip-flop control signal to clear flip-flop states of the count unit and the odd/even signal control unit.

5. The glitch-free frequency dividing circuit as recited in claim 4, wherein the divisor is an odd number.

6. The glitch-free frequency dividing circuit as recited in claim 4, wherein the divisor is an even number.

7. A frequency dividing device having an output pulse with a duty cycle of 50%, comprising:
- a pulse outputting unit, outputting the output pulse by a flip-flop according to a reference pulse;
- a count unit, connected to the pulse outputting unit and composed of a plurality of flip-flops connected in series, wherein the count unit receives the output pulse and outputs pulses having different count levels;
- a multiplexer, connected to the pulse outputting unit and the count unit, and selecting an output pulse from one of the pulse outputting unit and the count unit according to a divisor;
- an odd/even signal control unit, connected to the multiplexer and outputting an odd reset signal according to an output of the multiplexer at a negative edge of the reference pulse; and
- a reset control unit, receiving a control signal, a reset signal, the divisor, the odd reset signal, outputting a first flip-flop control signal to clear a flip-flop state of the pulse outputting unit and outputting a second flip-flop control signal to clear flip-flop states of the count unit and the odd/even signal control unit.

8. The frequency dividing device having an output pulse with a duty cycle of 50% as recited in claim 7, wherein the divisor is an odd number.

9. The frequency dividing device having an output pulse with a duty cycle of 50% as recited in claim 7, wherein the divisor is an even number.

10. A glitch-free frequency dividing method, comprising the steps of:
- dividing the frequency of a reference pulse according to a divisor and outputting a frequency divided output pulse by using a frequency dividing module;
- providing a control signal to said frequency dividing module during the frequency division, said frequency divided output pulse being maintained at a same state when the control signal is enabled;
- detecting a state of the frequency divided output pulse by using a latch module after a divisor switching signal is received by the latch module;
- enabling the control signal when the frequency divided output pulse detected by the latch module is at a pre-determined state, and switching the divisor when the frequency divided output pulse is as pre-determined; and
- disabling the control signal after the divisor is switched.

11. The glitch-free frequency dividing method as recited in claim 10, wherein the pre-determined state of the frequency divided output pulse is "0".

12. The glitch-free frequency dividing method as recited in claim 11, wherein the latch module comprises:
- a latch unit for divisor switching signals, latching the divisor switching signals and outputting a latch switching-on signal;
- a latch switching-on unit, receiving the latch switching-on signal and the frequency divided output pulse to output a latch signal by a trigger of the reference pulse;
- a latch register, latching the divisor to be switched according to the trigger of the latch signal and outputting the divisor to the frequency dividing module; and
- a recover unit, receiving the latch signal and outputting a recover signal by the trigger of the reference pulse;
- wherein the recover signal is delivered to the latch unit for divisor switching signals such that the latch switching-on signal is disabled and the control signal is disabled.

13. The glitch-free frequency dividing method as recited in claim 12, wherein the frequency dividing module comprises:
- a pulse outputting unit, outputting an output pulse by a flip-flop according to the reference pulse;
- a count unit, connected to the pulse outputting unit and composed of a plurality of flip-flops connected in series, wherein the count unit receives the output pulse and outputs pulses having different count levels;
- a multiplexer, connected to the pulse outputting unit and the count unit, and selecting an output pulse from one of the pulse outputting unit and the count unit according to the divisor;
- an odd/even signal control unit, connected to the multiplexer and outputting an odd reset signal according to an output of the multiplexer at a negative edge of the reference pulse; and
- a reset control unit, receiving a control signal, a reset signal, the divisor, the odd reset signal, outputting a first flip-flop control signal to clear a flip-flop state of the pulse outputting unit and outputting a second flip-flop control signal to clear flip-flop states of the count unit and the odd/even signal control unit.

14. The glitch-free frequency dividing method as recited in claim 13, wherein the divisor is an odd number.

15. The glitch-free frequency dividing method as recited in claim 13, wherein the divisor is an even number.

\* \* \* \* \*